United States Patent
Nakagawa et al.

(10) Patent No.: US 9,263,367 B2
(45) Date of Patent: Feb. 16, 2016

(54) SEMICONDUCTOR DEVICE

(71) Applicants: HONDA MOTOR CO., LTD., Tokyo (JP); FUJI ELECTRIC CO., LTD., Kawasaki-shi, Kanagawa (JP)

(72) Inventors: Takaki Nakagawa, Wako (JP); Daisuke Takeuchi, Wako (JP); Yasuhiro Maeda, Wako (JP); Hiromichi Gohara, Kawasaki (JP); Akira Morozumi, Kawasaki (JP); Takeshi Ichimura, Kawasaki (JP)

(73) Assignees: HONDA MOTOR CO., LTD., Tokyo (JP); FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/515,071

(22) Filed: Oct. 15, 2014

(65) Prior Publication Data

US 2015/0102480 A1 Apr. 16, 2015

(30) Foreign Application Priority Data

Oct. 16, 2013 (JP) ................................. 2013-215207

(51) Int. Cl.
 *H01L 23/473* (2006.01)
 *H01L 23/04* (2006.01)
 *H01L 23/367* (2006.01)

(52) U.S. Cl.
 CPC .......... *H01L 23/473* (2013.01); *H01L 23/3672* (2013.01); *H01L 23/3675* (2013.01); *H01L 2924/0002* (2013.01)

(58) Field of Classification Search
 None
 See application file for complete search history.

(56) References Cited

U.S. PATENT DOCUMENTS 7,190,581 B1 * 3/2007 Hassani et al. ................ 361/699

FOREIGN PATENT DOCUMENTS

| JP | 2001-35981 A | 2/2001 |
|---|---|---|
| JP | 2004-103936 A | 4/2004 |
| JP | 2011-155179 A | 8/2011 |
| JP | 2012-64609 A | 3/2012 |

* cited by examiner

*Primary Examiner* — Stanetta Isaac
(74) *Attorney, Agent, or Firm* — Birch, Stewart, Kolasch & Birch, LLP

(57) ABSTRACT

Provided is a semiconductor device comprising a cooler in which, by improving the shape of the connecting portions of an inlet/outlet of a coolant or the like, the pressure loss in the connecting portion or the like can be reduced.

A cooler 20 of a semiconductor device 1 includes: an inlet 27 and an outlet 28 provided on side walls 22b1, 22b2 of a case 22 opposing to each other at diagonal positions; an introduction path 24 which is connected to the inlet 27 and formed in the case 22; a discharge path 25 which is connected to the outlet 28 and formed in the case 22; and a cooling flow channel 26 between the introduction path 24 and the discharge path 25. The height of the opening of the inlet 27 is larger than the height of the introduction path 24, and a connecting portion 271 between the inlet 27 and the introduction path 24 includes an inclined surface 271b which is inclined from the bottom surface of the connecting portion 271 toward the longitudinal direction of the introduction path 24.

19 Claims, 5 Drawing Sheets

SEMICONDUCTOR DEVICE

TECHNICAL FIELD

The present invention relates to a semiconductor device comprising a cooler which circulates and distributes a coolant for cooling semiconductor elements.

BACKGROUND ART

Equipment which uses a motor represented by a hybrid automobile, an electric automobile or the like utilizes a power conversion device for energy saving. The power conversion device usually utilizes a semiconductor module. The semiconductor module comprises a power semiconductor element for controlling large current.

The heat value of the power semiconductor element is large when the element controls large current. Since miniaturization or lightweight of a semiconductor module is demanded and the output density tends to rise, the power conversion efficiency depends on a method of cooling the power semiconductor elements in a semiconductor module comprising a plurality of power semiconductor elements.

In order to improve the cooling efficiency of a semiconductor module, a liquid cooling type cooler has been conventionally used. Such a liquid cooling type cooler contains a fin as a heat sink, and cooling is performed by passing a coolant to circulate in the cooler. In order to improve cooling efficiency, a variety of elaborations have been made on liquid cooling type coolers such as increasing the flow rate of a coolant, improving the heat transfer coefficient by micronization and complication of a fin, and improving the thermal conductivity of a material which constitutes the fin.

However, when the flow rate of a coolant in a cooler is increased or a fin has a shape by which an excellent heat transfer coefficient is obtained, a problem that the pressure loss of a coolant inside the cooler is increased or the like is likely to occur. In particular, there is disclosed a cooler which uses a plurality of fins for cooling multiple power semiconductor elements, wherein the fins are provided in series in a flow channel (Patent document 1), and an increase of the pressure loss is remarkable in a cooler having such a constitution. In order to reduce such a pressure loss, a constitution in which cooling efficiency is improved with a low coolant flow rate is needed, and fins are desirably arranged in parallel in a flow channel.

Examples of a cooler in which cooling performance is maintained and pressure loss of a coolant is reduced by arranging fins in parallel in a flow channel include those in which an introduction path for introducing a coolant and a discharge path for discharging a coolant are arranged parallel to each other and a plurality of fins are arranged in parallel in cooling flow channels therebetween (Patent document 2, 3, 4).

RELATED ART DOCUMENTS

Patent Documents

Patent document 1: Japanese Unexamined Patent Application Publication No. 2012-64609
Patent document 2: Japanese Unexamined Patent Application Publication No. 2004-103936
Patent document 3: Japanese Unexamined Patent Application Publication No. 2001-35981
Patent document 4: Japanese Unexamined Patent Application Publication No. 2011-155179

SUMMARY OF THE INVENTION

Problems to be Solved by the Invention

However, although, in the cooler described in Patent documents 2 to 4, cooling performance has been improved by improving a fin or a flow channel in a case, pressure loss depending on an inlet of a coolant, the shape of an outlet, the connecting portion thereof or the like has occurred. Therefore, such a cooler has included a flow channel in which, although occurrence of a vortex is taken into account, pressure increase which mainly occurs at a connecting portion between an inlet, an outlet or the like is large and a load on a pump is large. For this reason, when the whole system of the cooler is taken into account, a load has been large for efficiently obtaining a stable cooling performance. When a load with respect to the pump performance is large, a pump having a large capacity or a design in which the flow rate of a coolant is reduced is needed, and problems that a heat generation temperature of a semiconductor element is increased or the like occur, the element life becomes short, or a failure or the like is likely to occur.

A cooler is needed to have a sufficient cooling performance while it is miniaturized and thinned for automobile applications or the like. Accordingly, for a cooler which is miniaturized and thinned, a pressure loss of a coolant have been needed to be reduced.

The present invention has been made in view of the above-mentioned points, and is aimed at providing a semiconductor device comprising a cooler in which, by improving the shape of an inlet of a coolant, a connecting portion of outlet or the like, the pressure loss in the connecting portion or the like can be reduced.

Means for Solving the Problems

In order to attain the above-mentioned object, the following semiconductor device is provided.

A semiconductor device comprising: an insulation circuit substrate; a semiconductor element mounted on the insulation circuit substrate; and a cooler which cools the semiconductor element connected to the insulation circuit substrate. The cooler comprises: a heat dissipation substrate joined to the insulation circuit substrate; a fin provided on a surface opposite to the joining surface with the insulation circuit substrate on the heat dissipation substrate; a case which houses the fin and at the same time is connected to the heat dissipation substrate; an inlet and an outlet for a coolant which are provided on side walls of the case, the side walls being opposed to each other, and are provided at diagonal positions of the case; an introduction path which is connected to the inlet and is formed along the inner surface of a first side wall on which the inlet of the case is provided; a discharge path which is connected to the outlet and is formed along the inner surface of a second side wall on which the outlet of the case is provided; and a cooling flow channel which is formed at a position where the fin is housed between the introduction path and the discharge path. The height of the opening of the inlet is larger than the height of the introduction path, and, at a connecting portion between the inlet and the introduction path, an inclined surface which is inclined in the longitudinal direction of the introduction path from the bottom surface of the connecting portion is provided.

Effects of the Invention

In consideration of disadvantages of miniaturizing and thinning of a cooler in view of pressure loss, according to a semiconductor device of the present invention, pressure rise can be reduced by partially expanding a flow channel of a connecting portion which connects a pipe at an inlet and an outlet. A semiconductor element arranged on the outer surface of the cooler can thus be effectively cooled, and a load on a pump which circulates a coolant is reduced, whereby stable operation of the semiconductor element can be attained.

MODE FOR CARRYING OUT THE INVENTION

Embodiments of a semiconductor device of the present invention will be concretely described with reference to Drawings. The terms indicating directions such as "upper", "lower", "bottom", "front", and "back" are used with reference to directions in the attached Drawings.

Figure 1:
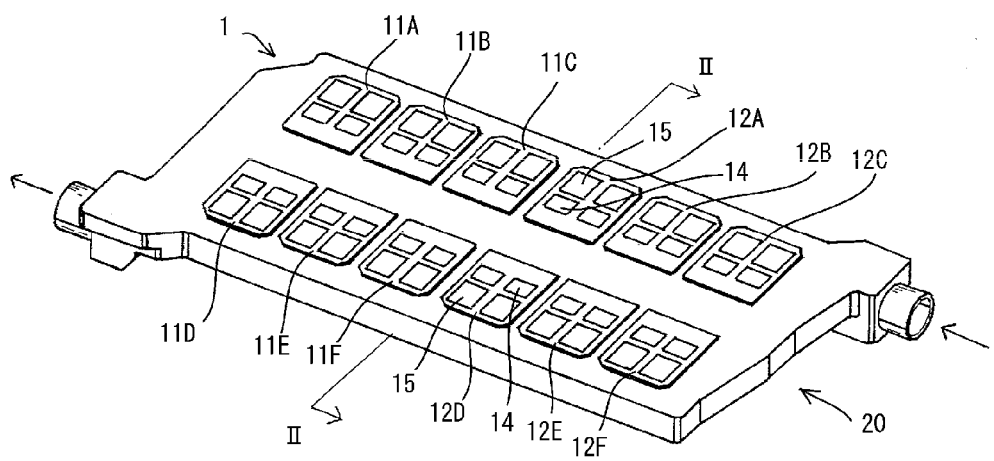
FIG. 1 is a perspective view illustrating the external appearance of a semiconductor module of the present invention.
Figure 2:
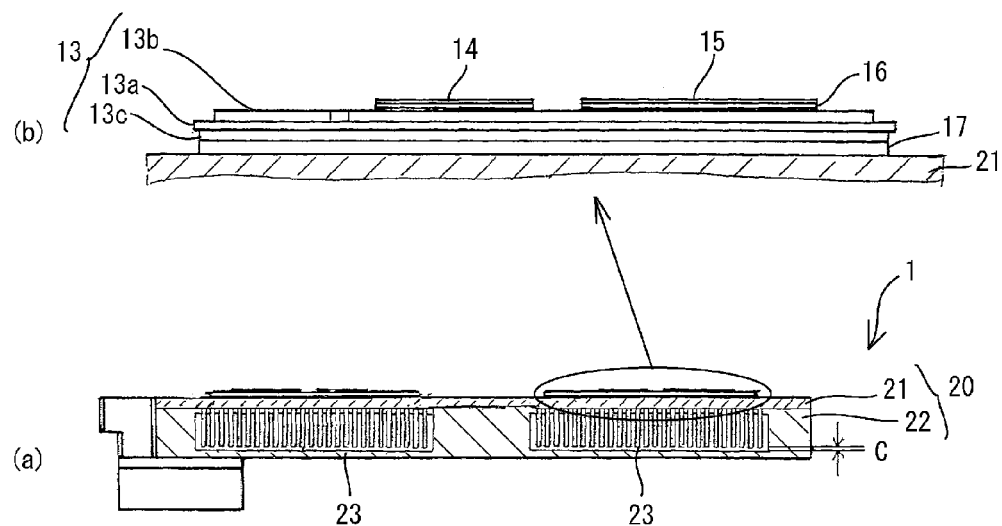
FIG. 2 is a schematic diagram illustrating one example of the semiconductor module of FIG. 1 in a cross sectional view from the arrow direction of the II-II line.

FIG. 1 is a perspective view illustrating the external appearance of one example of a semiconductor module which is one embodiment of a semiconductor device of the present invention. FIG. 2 (a) is a schematic diagram of the semiconductor module of FIG. 1 illustrated as a cross sectional view from the arrow direction of the II-II line, and FIG. 2 (b) is an enlarged partial schematic diagram of FIG. 2 (a).

As illustrated in FIG. 1 and FIG. 2 (a), (b), the semiconductor module 1 comprises a plurality of circuit element units 11A to 11F, 12A to 12F, and a cooler 20 to which the circuit element units 11A to 11F, 12A to 12F are connected.

Each of the circuit element units 11A to 11F, 12A to 12F has a constitution in which two semiconductor elements for each of two types of semiconductor elements 14, 15, four semiconductor elements in total are mounted on an insulation circuit substrate 13. As seen from FIG. 2 (b), the insulation circuit substrate 13 has a constitution in which conductive layers 13b, 13c are formed on both sides of an insulation substrate 13a.

For the insulation substrate 13a of the insulation circuit substrate 13, an insulating ceramic substrate such as aluminium nitride or aluminium oxide can be used. The conductive layers 13b, 13c can be formed by using a metal such as copper or aluminium (for example, copper foil).

The semiconductor elements 14, 15 are joined to the insulation circuit substrate 13 on the conductive layer 13b side by using junction layer 16 such as solder and are electrically connected to the conductive layer 13b through the junction layer 16 or via a bonding wire (not illustrated). The insulation circuit substrate 13 on which the semiconductor elements 14, 15 are mounted is joined to a heat dissipation substrate 21 of the cooler 20 on the other conductive layer 13c side via a junction layer 17.

The insulation circuit substrate 13 and semiconductor element 14, 15 are thus in a state in which they are thermally conductively connected to the cooler 20. On an exposed surface on the conductive layer 13b, 13c or on the surface of a bonding wire (not illustrated) which electrically connects the semiconductor element 14, 15 and the conductive layer 13b, a protection layer such as nickel plating may be formed in order to protect the surface from a stain, corrosion, an exterior force, or the like.

For such semiconductor elements 14, 15 which are mounted on the insulation circuit substrate 13, in the illustrated example, power semiconductor elements are used. Among such power semiconductor elements, one of the semiconductor element 14 is a FWD (FreeWheeling Diode), and the other of the semiconductor element 15 is an IGBT (InsulatedGate Bipolar Transistor).

Figure 3:
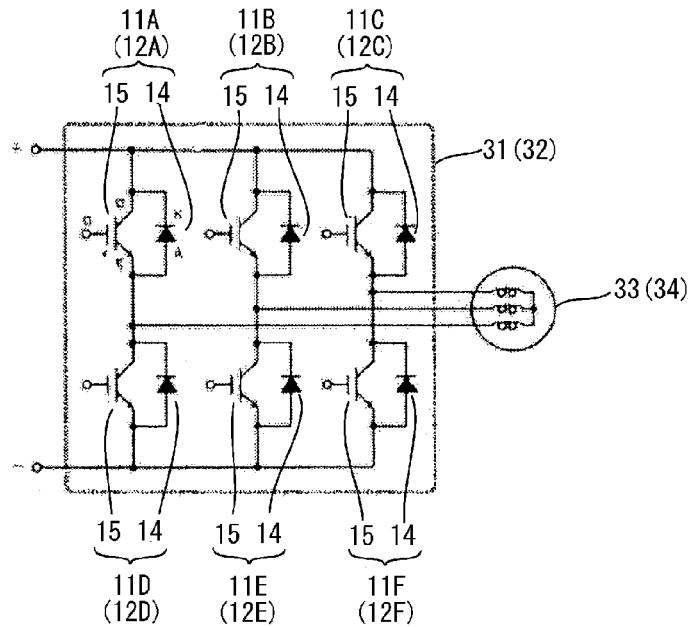
FIG. 3 is a view illustrating one example of a power conversion circuit which is constituted as a semiconductor module.

As illustrated in FIG. 3, in the semiconductor module 1, an inverter circuit 31 can be constituted by six circuit element units 11A to 11F, and an inverter circuit 32 can be constituted by six circuit element units 12A to 12F.

The inverter circuits 31, 32 in FIG. 3 illustrates an inverter circuit which converts a direct current into an alternating current and supplies the alternating current to three-phase AC motors 33, 34. The inverter circuit 31 has a constitution in which input and output or control is performed by using circuit element units 1 IA to 11C as upper arms and circuit element units 11D to 11F as lower arms and by connecting wiring (not illustrated) by wire bonding, bus bar, or the like. The inverter circuit 32 has a constitution in which input and output or control is performed by using circuit element units 12A to 12C as upper arms and circuit element units 12D to 12F as lower arms and by connecting wiring (not illustrated) by wire bonding, bus bar, or the like. Each of the inverter circuits 31, 32 comprises a bridge circuit between the semiconductor element 15 which is an IGBT and the semiconductor element 14 which is a FWD for each of three phases, U phase, V phase and W phase. By performing switching control of the semiconductor element 15, a direct current can be converted into an alternating current to drive three-phase AC motors 33, 34.

The power conversion circuit illustrated in FIG. 3 constitutes the inverter circuit 31 or 32 by six circuit element units 11A to 11F or six circuit element units 12A to 12F. However, as 12 circuit element units 11A to 11F and 12A to 12F are illustrated in FIG. 1, the number of circuit element units mounted on the cooler 20 is not limited to six. FIG. 1 illustrates an inverter circuit for controlling two motors 33 and 34, which has a constitution comprising a total of 12 circuit element units by mounting 11A to 11C as upper arms and 11D to 11F as lower arms on the cooler 20 for the inverter circuit 31 and by mounting 12A to 12C as upper arms and 12D to 12F as lower arms on the cooler 20 for the inverter circuit 32. There is another constitution in which a circuit element unit using predetermined numbers of IGBT and FWD for performing a step-up/down control is mounted on a cooler. In any of these constitutions, the cooler 20 with a size adapted for an area where the circuit element unit is arranged is used.

The cooler 20 comprises: a case 22 which is provided with an opening on the upper side and has a box shape; a heat dissipation substrate 21 having a plane shape which is connected to the upper end of a side wall of the case 22 without liquid leakage; and a fin 23 which is attached to the surface of the heat dissipation substrate 21 opposite to the surface to which the circuit element units 11A to 11F, 12A to 12F are joined and which has a heat exchanging performance as a heat sink. The plurality of fins 23 are housed inside the case 22, and the case 22 and the heat dissipation substrate 21 are hermetically closed by metallically joining each other or by interposing a seal member therebetween. In order to facilitate a metallical joining operation between the case 22 and the heat dissipation substrate 21, it is desirable that a junction of each of the case 22 and the heat dissipation substrate 21 is flat.

During operation of the power conversion circuit which is mentioned above with reference to FIG. 3, heat generated in each of the circuit element units 11A to 11F, 12A to 12F is transmitted to the heat dissipation substrate 21 through the junction layer 17, and is further transmitted to the fin 23. Since the fin 23 inside the cooler 20 is arranged in the cooling flow channel mentioned below, a coolant is distributed in the cooling flow channel to cool the fin 23. The circuit element units 11A to 11F, 12A to 12F which generate heat are cooled by the cooler 20 in such a manner.

Figure 4:
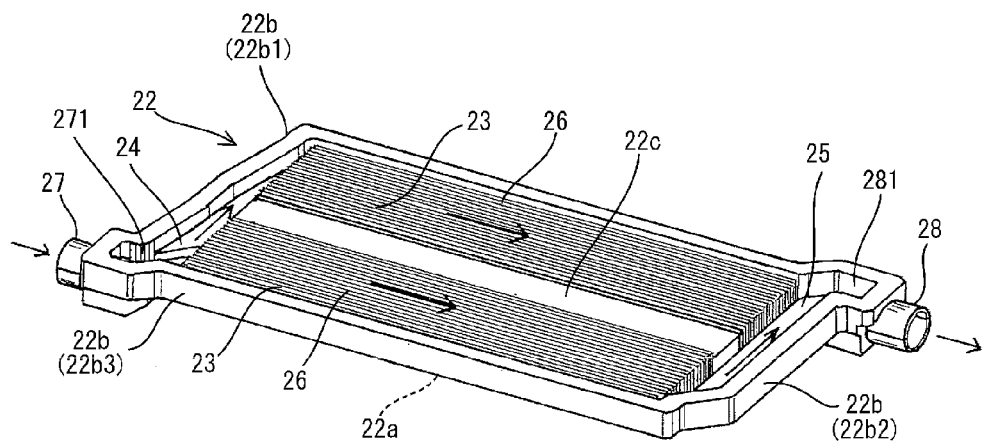
FIG. 4 is a perspective view illustrating the constitution of a main section of a case of a cooler.
Figure 5:
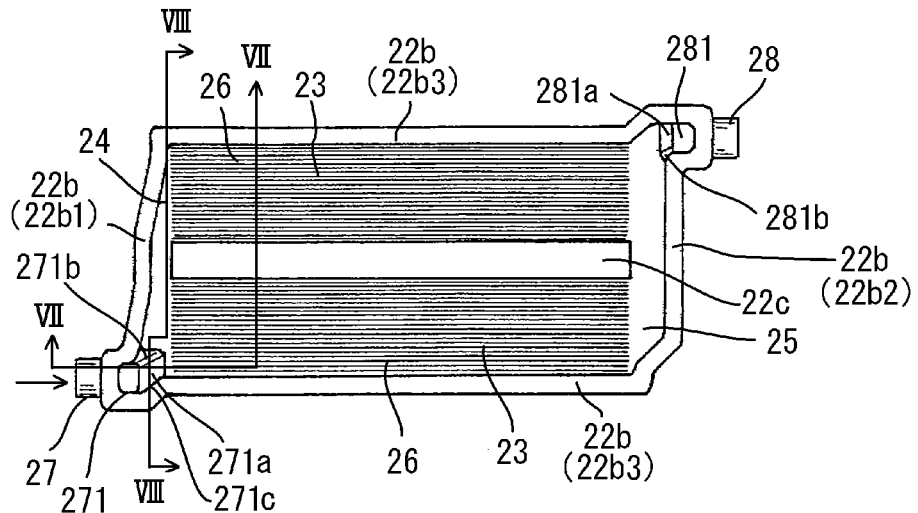
FIG. 5 is a plan view illustrating the internal structure of the case of FIG. 4.

FIG. 4 is a perspective view illustrating the constitution of a main section of the case 22 of the cooler 20, and the arrow represents the direction in which a coolant flows. For convenience of explanation, FIG. 4 also illustrates the fin 23 which is attached to the heat dissipation substrate 21. FIG. 5 is a plan view illustrating the internal structure of the cooler 20 illustrated in FIG. 4.

As illustrated in FIG. 4, FIG. 5, the external shape of the case 22 of the cooler 20 is substantially cuboid having a bottom wall 22a and side wall 22b. Inside the case 22, an introduction path 24 for introducing a coolant toward fin 23, a discharge path 25 for discharging a coolant which has passed through the fin 23, and a cooling flow channel 26 on which the fin 23 is arranged are formed. The cooling flow channel 26 is divided by a center wall 22c of the case 22 into two. Further, an inlet 27 for introducing a coolant to the inside of the case 22 is provided on one of short sides of the side wall 22b of the case 22, a side wall 22b1 (first side wall), and an outlet 28 for discharging a coolant from the inside of the case 22 to the outside thereof is provided on the other side wall 22b2 (second side wall) of short sides of the case 22. The inlet 27 and outlet 28 are provided at diagonal positions of the case 22. The axes of the inlet 27 and the outlet 28 are substantially in parallel with the longitudinal direction of the cooling flow channel 26, or the direction in which a coolant distributes in the cooling flow channel 26 (a direction indicated by the arrow in FIG. 4).

The introduction path 24 is formed along the inner surface of the side wall 22b1 which is one of short sides of the case 22 on which the inlet 27 is provided. The introduction path 24 is connected to the inlet 27 via a connecting portion 271 by which a pipe for introducing a coolant is connected, and is formed such that a coolant is dispersed and flows on the cooling flow channel 26. The connecting portion 271 is positioned at the corner at which the longitudinal direction of the introduction path 24 and the axis of the inlet 27 are crossed.

The discharge path 25 is formed along the inner surface of the side wall 22b2 which is on the short side of the case 22 on which the outlet 28 is provided. The discharge path 25 is connected to the outlet 28 via a connecting portion 281 by which a pipe for discharging a coolant is connected, and is formed such that a coolant which has passed through the cooling flow channel 26 is discharged from the outlet 28.

The cooling flow channel 26 is formed at a position where the fin 23 is housed between the introduction path 24 and discharge path 25, and thereby constituted such that a coolant flows at a portion which is needed for cooling the fin 23 as a heat sink. Since the introduction path 24 and discharge path 25 are formed such that they are along the side walls 22b1, 22b2 of the short sides of the case 22, the length of a coolant in the flow direction in the cooling flow channel 26 is larger than the length of a coolant in the flow direction in the introduction path 24 and discharge path 25. The above is advantageous for miniaturizing the cooler 20.

The cooling flow channel 26 can be divided into a plurality of flow channels by fitting the positions of circuit element units. For example, in the embodiment illustrated in FIG. 4, the cooling flow channel 26 is divided into two by a partition 22c connecting to the introduction path 24 and discharge path 25. The longitudinal directions of the introduction path 24 and discharge path 25 are substantially orthogonal to the longitudinal direction of the cooling flow channel 26.

Heat is generated at positions on the heat dissipation substrate 21 to which the circuit element units 11A to 11F, 12A to 12F on which the semiconductor elements 14, 15 are mounted are joined. Accordingly, the cooling flow channel 26 is divided into two, and the divided flow channels are made to correspond to the circuit element units 11A to 11C, 12A to 12C which are upper arms of the inverter circuit, and circuit element units 11D to 11F, 12D to 12F which are lower arms of the inverter circuit, respectively. In other words, the divided flow channels form two cooling flow channels flowing immediately below the circuit element units in parallel to each other. This makes it possible to improve the cooling efficiency.

The cooling flow channel 26 is provided with a plurality of fins 23. A heat sink composed of a plurality of fins has a substantially cuboid external shape and is arranged parallel to the direction in which a coolant flows in the cooling flow channel 26.

Figure 6:
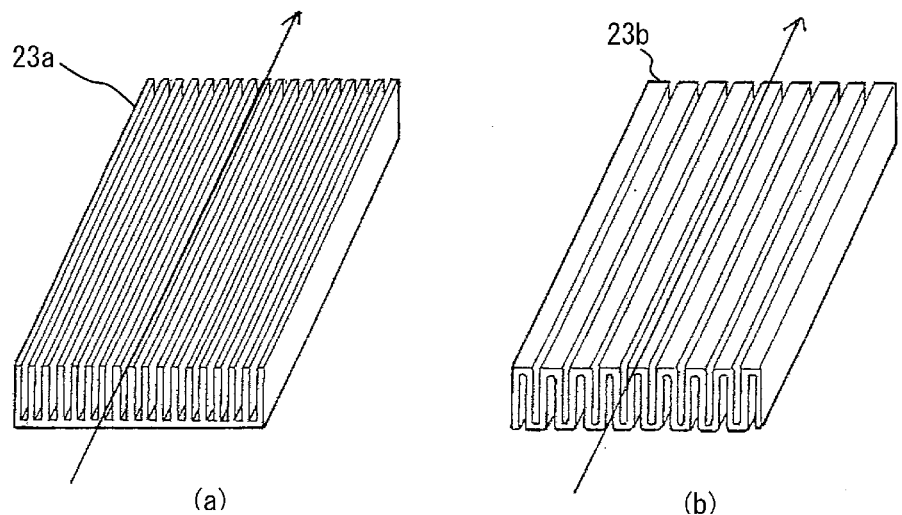
FIG. 6 is views illustrating two types of shapes of a fin: (a) is a perspective view illustrating a blade fin; and (b) is a perspective view illustrating a corrugated fin.

FIG. 6 is an explanatory drawing of the shape of the fin. The fin 23 of the cooler 20 can be constituted, for example, as a plurality of blade fins 23a which are formed by arranging plate-shaped fins in parallel to each other as illustrated in FIG. 6 (a). The blade fins 23a are arranged in the cooling flow channel 26, and a coolant flows in the direction indicated by an arrow in FIG. 6 (a). The blade fins 23a are fixed on the heat dissipation substrate 21 and integrated therewith. The fin 23 of the cooler 20 is not limited to the blade fin 23a of FIG. 6 (a), and a corrugated fin 23b illustrated in FIG. 6 (b) can also be used.

When the blade fin 23a is provided in the case 22 by being integrated with the heat dissipation substrate 21, the blade fin is formed to have a size (height) such that there exists a certain clearance C between the tip thereof and the bottom wall 22a of the case 22. When the corrugated fin 23b is used, the corrugated fin is formed to have a shape not having a clearance C by being integrating with case 22 by soldering.

With regard to the shape of the fin 23, a variety of conventionally known shapes can be employed. However, since the fin 23 is a resistance for a coolant flowing in the cooling flow channel 26, those having a small pressure loss against a coolant are desired, and therefore, the above-mentioned blade fin 23a or corrugated fin 23b is preferred. Preferably, the shape and the size of the fin 23 are appropriately set in consideration of conditions (i.e. pump performance or the like) for introducing a coolant in the cooler 20, the type (viscosity or the like) of a coolant, a target amount of heat removed, or the like. The external shape of the heat sink composed of the fin 23 is substantially cuboid, and preferably is cuboid, and a chamfered or deformed shape may be employed without compromising the effect of the invention.

When the cooler 20 is used, for example, a pipe to be connected to a pump (not illustrated) to be provided on the upstream side of an inlet 27 is connected to the inlet 27, a pipe to be connected to a heat exchanger (not illustrated) to be provided on the downstream side of an outlet 28 is connected to the outlet 28, whereby a coolant after exchanging heat in the heat exchanger is introduced to the pump to constitute a closed loop coolant flow channel including the cooler 20, pump and heat exchanger. A coolant is forcibly circulated in such a closed loop by a pump.

The heights (diameters) of the openings of the inlet 27 and outlet 28 provided on the side wall 22b1, 22b2 of the case 22 have a predetermined dimension in order that a coolant at a predetermined flow rate can be introduced into the case 22 and discharged from the inside of the case 22 with a low load. The introduction path 24, discharge path 25 and cooling flow channel 26 in the case 22 are miniaturized and thinned as much as possible to an extent to have a predetermined cooling performance. For this reason, as illustrated in FIG. 1, in the cooler 20, the height of the opening of the inlet 27 is greater than the height of the introduction path 24.

Figure 7:
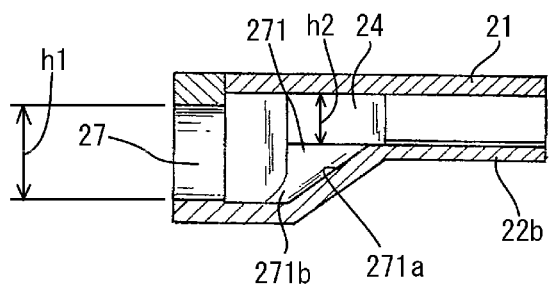
FIG. 7 is a schematic cross-sectional view illustrating a connecting portion of Example.
Figure 8:
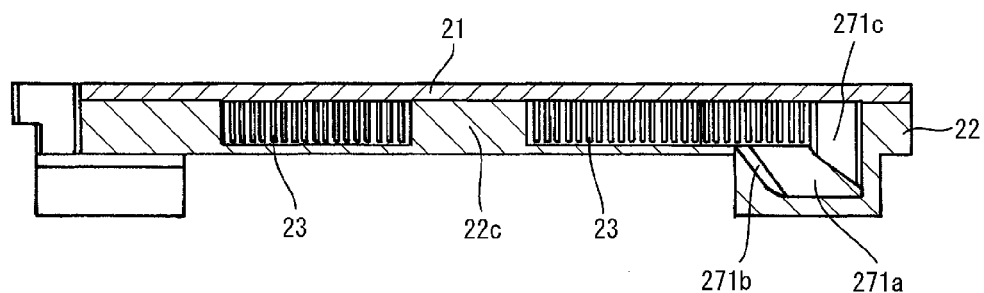
FIG. 8 is a cross sectional view from the arrow direction of the VIII-VIII line of FIG. 5.

FIG. 7 illustrates a schematic cross sectional view of the connecting portion 271 of the inlet 27 which connects a pipe on the pump side which is not illustrated with a body of the case 22, viewed from the arrow direction of the VII-VII line in FIG. 5. FIG. 8 is a schematic diagram illustrating the internal structure of the case of FIG. 5 as a cross sectional view from the arrow direction of the VIII-VIII line. FIG. 7 and FIG. 8 also illustrate a the heat dissipation substrate 21 together with the fin 23. The height of the opening of the inlet 27 is h1, and the height of the introduction path 24 is h2. The connecting portion 271 comprises a first inclined surface 271a which is inclined from the bottom surface toward the depth direction (the longitudinal direction of the cooling flow channel 26) viewed from the inlet 27 to be connected with the bottom surface of the introduction path 24. In the example of FIG. 7, h1>h2, and the bottom surface of the inlet 27 is formed apart from the bottom surfaces of the introduction path 24 and the cooling flow channel 26 from the tip of the fin 23 in the thickness direction. The first inclined surface 271a is inclined from the outside of the bottom wall 22a of the case 22 toward the upper side of the cooler 20, the fin 23. The connecting portion 271 comprises a second inclined surface 271b which is inclined from the bottom surface toward the longitudinal direction of the introduction path 24 to be connected to the bottom surface of the introduction path 24. The second inclined surface 271b is also inclined toward the upper side of the cooler 20. The angle formed by the upper surface of the cooler 20 and the second inclined surface 271b is smaller than 90°.

Since the connecting portion 271 comprises the first inclined surface 271a, a coolant which has been introduced from the inlet 27 flows along the first inclined surface 271a, and introduced to the introduction path 24 and cooling flow channel 26 while the cross section of the flow channel in the flowing direction is gradually decreased. Therefore, when the connecting portion 271 only comprises the first inclined surface 271a, the pressure loss at the connecting portion 271 may be large.

For this reason, the connecting portion 271 comprises the second inclined surface 271b. When the connecting portion 271 comprises the second inclined surface 271b, a coolant which has been introduced from the inlet 27 flows along the second inclined surface 271b in the longitudinal direction of the introduction path 24 to be introduced to the introduction path 24 while the cross section of the flow channel in the flowing direction is gradually expanded. Therefore, since the connecting portion 271 comprises not only the first inclined surface 271a but also the second inclined surface 271b, the flow channel of the connecting portion 271 can be partially expanded compared with cases in which only the first inclined surface 271a is contained, and thus, the pressure loss in the connecting portion 271 can be effectively reduced. By this, the semiconductor elements 14, 15 of the circuit element units 11A to 11F, 12A to 12F which are joined to the heat dissipation substrate 21 of the cooler 20 can be effectively cooled, thereby reducing a load to the pump which circulates a coolant, which makes it possible to stably operate the semiconductor element.

Further, the connecting portion 271 comprises a third inclined surface 271c. In the longitudinal direction of the introduction path 24, one side surface of the two side surfaces of the inlet 27 is formed apart from the fin 23 from the inner surface of one side wall 22b3 (i.e., a third side wall connecting the first side wall 22b1 and the second side wall 22b2) on the long side of the side walls 22b of the case 22. The third inclined surface 271c is inclined from the outside of the side wall 22b3 on the long side of the case 22 toward the fin 23. The third inclined surface 271c is formed at a position opposing to the second inclined surface 271b. By providing the third inclined surface 271c in addition to the second inclined surface 271b; the coolant introduced from the inlet 27 is guided to the longitudinal direction of the introduction path 24 and flows along the second inclined surface 271b. As the result, multiple power semiconductor elements can be cooled almost equally.

The connecting portion 271 comprises at the lower side of the third inclined surface 271c an inclined surface which is connected to the third inclined surface 271c and is inclined from the outside of the bottom wall 22a of the case 22 toward the fin 23. By providing the inclined surface in addition to the third inclined surface 271c, the coolant introduced from the inlet 27 is guided to the longitudinal direction of the introduction path 24 and flows along the second inclined surface 271b. As the result, multiple power semiconductor elements can be cooled almost equally.

While FIG. 7 illustrates the connecting portion 271 of the inlet 27, the connecting portion 281 of the outlet 28 also can have a constitution comprising first inclined surfaces 281a and second inclined surfaces 281b in a similar manner (see FIG. 5). When the connecting portion 281 of the outlet 28 comprises the first inclined surface 281a and second inclined surface 281b, the pressure loss at the connecting portion 281 can be effectively reduced.

The inlet 27 and outlet 28 are provided at diagonal positions of the case 22, thereby preventing a coolant introduced from the pipe connected to the inlet 27 from directly hitting the fin 23 and thereby making the flow rate in the cooling flow channel 26 uniform. In the case illustrated in FIG. 4, FIG. 5, the inlet 27 is provided on the side wall 22b1 of the short side of the case 22 at a position extended further toward the end side in the width direction in order that the axis direction of a pipe connected to the inlet 27 is oriented toward the side wall 22b3 on the long side of the case 22. When the inlet 27 is provided at such a position, there is a large concern that the pressure loss at the connecting portion 271 of the inlet 27 is increased. In this respect, since, in the present embodiment, the connecting portion 271 comprises the second inclined surface 271b as mentioned above, the pressure loss can be effectively reduced.

The introduction path 24 is formed in a shape in which the width of the flow channel is gradually decreased toward the downstream side of the introduction path 24 in order that the cross section of the introduction path 24 is reduced on the downstream side of the introduction path 24. By this, the flow rate distribution of a coolant can be made uniform between the cooling flow channel 26 connected to the introduction path 24 on the downstream side and the cooling flow channel 26 connected to the introduction path 24 on the upstream side.

The case 22 having such a constitution can be formed by using a metallic material such as aluminium, an aluminium alloy, copper, a copper alloy, or the like. For example, a material such as A1050 or A6063 is preferred, and when sealing with an inverter case housing peripheral members, in particular, a fixing member or a power module, a material such as ADC12 or A6061 is preferred. When the case 22 is manufactured by die casting and a thermal conductivity is demanded, a material of DMS series which is a high thermal conductivity aluminium alloy for die casting manufactured by Mitsubishi Plastics, Inc. can also be applied. When the case 22 is formed by using such a metallic material, the above-mentioned introduction path 24, discharge path 25, cooling flow channel 26, inlet 27 and connecting portion 271, outlet 28 and connecting portion 281 as mentioned above can be formed. Although the shapes of the connecting portion 271 and connecting portion 281 are complicated, the case 22 having such a complicated shape can be easily manufactured by die casting. For the case 22, a metallic material containing a carbon filler other than the above can be used. Ceramic material, resin materials, or the like can also be used depending on the type of a coolant, the temperature of a coolant flowing in the case 22, or the like.

The fin 23 and the heat dissipation substrate 21 can be formed by using a metallic material such as aluminium, an aluminium alloy, copper, or a copper alloy in a similar manner to the case 22. For example, A1050, A6063, or the like is desired. More preferably, aluminium having a thermal conductivity of 200 W/mK or higher can be used. The fin 23 and the heat dissipation substrate 21 may be formed of the same metallic material or different metallic materials. Other than the above-mentioned blade fin 23a, corrugated fin 23b, or the like, the fin 23 can be formed, for example, by joining a predetermined pin or plate body formed by using a metallic material to a metallic substrate. The fin 23 can be formed integrally with the heat dissipation substrate 21 itself by die casting or soldering. Further, the fin 23 can also be formed by forming a portion by which the fin 23 is to be formed from the heat dissipation substrate 21 in a convex shape by die casting, and then cutting the portion in a fin shape by a wire cut method.

Although the upper end of the side wall 22b of the case 22 and the end portion of the heat dissipation substrate 21 can be sealed by interposing an O-ring or the like therebetween, they are preferably metallically joined to each other along the side wall 22b from the viewpoint of surely preventing liquid leakage. The metallical joining is more preferably a friction stir welding method (Friction Stir Welding). A junction by a friction stir welding method has a metal structure which is characteristic of the friction stir welding method. By using the friction stir welding method, joining between the upper end of the side wall 22b of the case 22 and the end portion of the heat dissipation substrate 21 can be surely made. Since, by the friction stir welding method, joining can be performed by applying a tool of the friction stir welding method from the upper side toward the joining interface between the case 22 and the heat dissipation substrate 21 while supporting the bottom surface of the case 22, joining can be performed more surely. Further, by performing joining by a friction stir welding method, the heat dissipation can be improved by using a material having a high thermal conductivity such as alloys of A6063 and DMS series, HT-1 which is a high thermal conductivity aluminium alloy for die casting manufactured by Daiki Aluminium Industry Co., Ltd. as a material of the heat dissipation substrate 21. In other words, by using a material having a higher thermal conductivity than that of the case 22, which is a material having different composition from the material of the case 22, for the material of the heat dissipation substrate 21, the heat dissipation can be improved.

When the case 22 comprises a partition 22c, it is preferred that the partition 22c is also joined to the heat dissipation substrate 21 by the friction stir welding method since expansion of a clearance C between the fin 23 and the bottom wall 22a of the case 22 due to thermal deformation of the heat dissipation substrate 21 can be prevented.

When the case 22 and the heat dissipation substrate 21 are joined by a friction stir welding method, it is preferred that the upper end of the side wall 22b of the case 22 and the end portion of the heat dissipation substrate 21 are at least flat, and that the heat dissipation substrate 21 preferably has a plane shape since joining is made easy. When the heat dissipation substrate 21 has a predetermined thickness, a reliability to thermal deformation and a favorable heat dissipation can be obtained. The thickness of the heat dissipation substrate 21 is desirably, for example, 1 to 3 mm in a region where a fin is joined. Further, by arranging the inlet 27 such that the upper surface of the inlet 27 is lower than the bottom surface of the heat dissipation substrate 21, turbulences generated at the inlet 27 and the connecting portion 271 can be minimized, thereby facilitating joining and improving the cooling efficiency.

As mentioned above, the axis of the inlet 27 is deviated toward the outside of the case viewed from the top of the fin 23, and the cooling efficiency can be improved by the cooler 20 comprising the connecting portion 271 at least comprising the second inclined surface 271b.

EXAMPLE AND COMPARATIVE EXAMPLE 1

Figure 9:
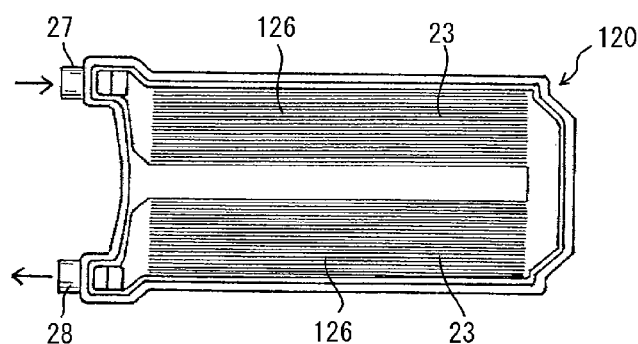
FIG. 9 is a plan view illustrating the constitution of a main section of a cooler of Comparative Example 1.

FIG. 9 is a plan view illustrating the constitution of a main section of a cooler as a semiconductor module of Comparative Example 1. A cooler 120 in FIG. 9 has a constitution in which two cooling flow channels 126 are connected to each other in series, which is compared to the cooler 20 of Example illustrated in FIG. 5. Example and Comparative Example 1 are common in that the circuit element units of the semiconductor module are divided into two rows of upper arm side and the lower arm side constituting each circuit and that a cooling flow channel is provided immediately below the circuit element unit of each of the rows.

Figure 10:
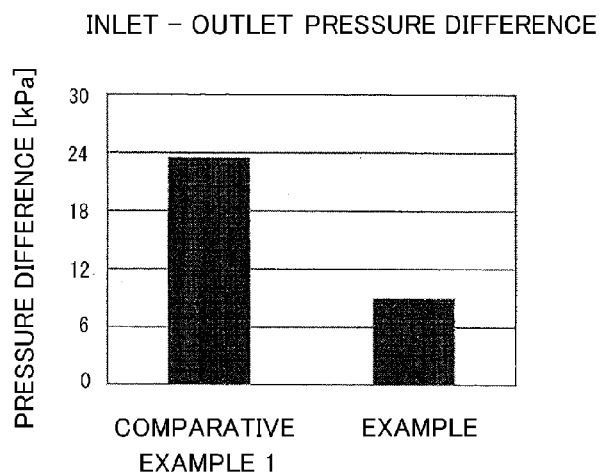
FIG. 10 is a graph illustrating pressure differences between an inlet and an outlet for a coolant in Comparative Example 1 and Example.

FIG. 10 is a graph illustrating the result obtained by examining the pressure difference between the inlet and the outlet for a coolant for Comparative Example 1 and Example. As seen from FIG. 10, Comparative Example in which a plurality of cooling flow channels are connected to each other in series and Example in which two divided cooling flow channels 26 are connected to each other in parallel are largely different from each other in the pressure difference generated in the flow channel. According to the comparison result by a thermal fluid simulation, when a coolant is allowed to flow at 10 L/min, the pressure difference is 23.5 kPa in Comparative Example 1, and the pressure difference is 9 kPa in Example. The result of FIG. 10 shows the difference of the cross section of the flow channel when a coolant flows in two cooling flow channels at the same time. In Example in which the pressure difference is small, it is possible to reduce a load to a pump for circulating a coolant. When a plurality of circuit element units are provided in the cooler and a coolant is allowed to flow along the alignment direction of the circuit element units to perform cooling, since heat from the semiconductor element is received by the coolant, the temperature of the coolant itself is increased. Therefore, the temperature of a coolant is increased depending on the number of the semiconductor elements. The cooling performance at that time depends on the temperature of the coolant and the constitution of the flow channels. Among the cooling performances, the maximum temperature of the semiconductor element is determined by the flow rated of a coolant flowing in the cooling flow channel and the temperature of the coolant itself. It is found that, in consideration of the heat value of the semiconductor element between Comparative Example 1 and Example, the maximum temperature is at a similar level, and Example in which a pump load can be reduced has a favorable cooling performance.

The pressure difference between the inlet 27 and the outlet 28 for a coolant depends not only on the shape of the fin 23 which is arranged in the cooling flow channel 26 but also on the cross section of the introduction path 24, discharge path 25, and cooling flow channel 26. For example, when the cross section of the flow channel (flow channel width) of the introduction path 24 is decreased on the downstream side along the direction in which a coolant flows for the purpose of miniaturization or of adjusting the flow rate distribution of a coolant flowing in the cooling flow channel 26, the pressure difference between the inlet 27 and the outlet 28 for a coolant becomes large, thereby increasing a load on a pump. In this respect, since in Example, the connecting portion 271 of the inlet 27 comprises the second inclined surface 271b as mentioned above, the pressure loss at the connecting portion 271 can be reduced and a load on the pump can be reduced.

Although the constitution of the semiconductor module 1 illustrated in FIG. 1, FIG. 2 shows a constitution in which the heat dissipation substrate 21 and the case 22 are joined by a friction stir welding method to be integrated, even when the case 22 and the heat dissipation substrate 21 comprising the fin 23 are constituted separately and both of them are sealed via an O-ring to form a modular structure, by employing a structure in which two cooling flow channels 26 are arranged in parallel to each other as the flow channel of Example, a load on a pump can be reduced.

The above is based on the result verified by performing simulation of the properties (coolant properties) and cooling performance of the coolant itself.

EXAMPLE AND COMPARATIVE EXAMPLE 2

In the above-mentioned Example, in order to decrease the pressure difference when a coolant flows between the inlet 27 and the outlet 28 of the cooler 20 for the purpose of establishing compatibility with miniaturization of the cooler, the connecting portion 271 of the inlet 27 and the connecting portion 281 of the outlet 28 comprise inclined surfaces 271b and 281b. Explanation will be made for comparing the shapes when the inclined surfaces 271b, 281b exist or not.

Figure 11:
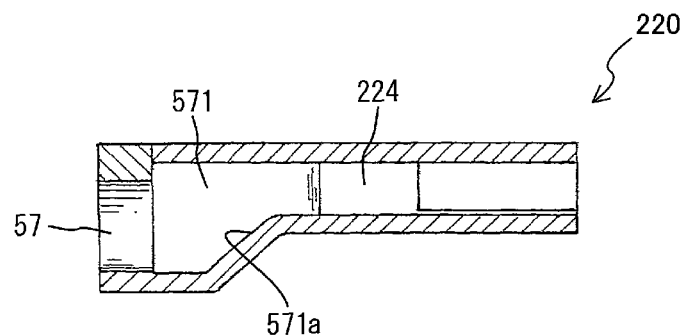
FIG. 11 is a schematic cross-sectional view illustrating a connecting portion of Comparative Example 2.

FIG. 11 illustrates a cross-sectional view of a connecting portion of an inlet 57 of a cooler 220 as a semiconductor module of Comparative Example 2. A connecting portion 571 of FIG. 11 has a constitution in which an inclined surface 571a is provided on the connecting portion 571 at a position where the inclined surface 571a is not overlapped with the introduction path 224, which is compared to the constitution of the connecting portion 271 of Example illustrated in FIG. 7.

Both the connecting portion 271 of Example of FIG. 7 and the connecting portion 571 of Comparative Example 2 of FIG. 11 differ in the heights of the inlets 27 and 57 and the heights of the cooling flow channels 26, 226. In view of restriction of the shapes, the connecting portion is provided with the first inclined surface 271a and the inclined surface 571a. In Example, not only the first inclined surface 271a but also the second inclined surface 271b is provided. On the other hand, in Comparative Example 2, the inclined surface 571a is provided at a position not to be overlapped with the introduction path 224, and there is not an inclined surface inclined from the bottom surface in the longitudinal direction of the introduction path 224.

In Example and Comparative Example 2, the flow channel heights of the connecting portions of the inlet 27, 57 are set to 20 mm and the height of the fin 23 is set to 8 mm, and the difference 12 mm from the bottom of the connecting portion 271, 571 to the cooling flow channel 26 is connected by providing the shape of the case with a predetermined slope in a range between 15° to 75°. The slope is determined by the width of the connecting portion of the introduction path 24, 224, and a structure having a slope of 40° in Example and a structure having a slope of 45° in Comparative Example 2 are taken as examples to compare the pressure loss generated in the flow channel by the pressure difference between the inlets 27, 57 and the outlets 28, 58.

Figure 12:
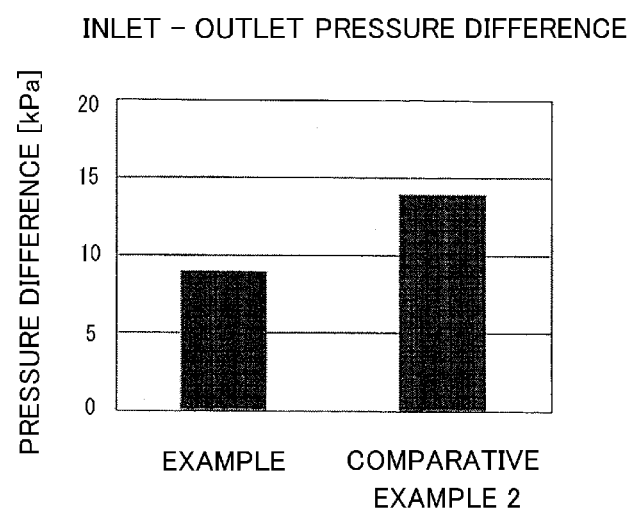
FIG. 12 is a graph illustrating pressure differences between an inlet and an outlet for a coolant in Comparative Example 2 and Example.

The results obtained by examining the pressure difference between the inlet and the outlet for a coolant for Example and Comparative Example 2 by simulation are illustrated in FIG. 12 by way of a graph.

As seen from FIG. 12, when each coolant is introduced at a flow rate of 10 L/min, the pressure difference between the inlet 27 and the outlet 28 in Example is approximately 9 kPa, and the pressure difference between the inlet 57 and the outlet in Comparative Example 2 is 14 kPa, thereby expecting approximately 35% reduction. The state of heat generation was confirmed by simulation arranging the circuit element unit illustrated in FIG. 1 on the cooler to find that the cooling performance was similar.

From the above results, according to Example, miniaturization and low pressure loss in which a load on a pump is low can be attained at the same time.

DESCRIPTION OF SYMBOLS

1 Semiconductor module
11A to 11F, 12A to 12F Circuit element unit
13 Insulation circuit substrate
13a Insulation substrate
13b, 13c Conductive layer
14, 15 Semiconductor element
16, 17 Junction layer
20 Cooler
21 Heat dissipation substrate
22 Case
23 Fin
24 Introduction path
25 Discharge path 26 Cooling flow channel
27 Inlet
271 Connecting portion
28 Outlet
281 Connecting portion
31, 32 Inverter circuit
33, 34 Three-phase AC motor
C Clearance

The invention claimed is:

1. A semiconductor device comprising:
an insulation circuit substrate:
a semiconductor element mounted on the insulation circuit substrate; and
a cooler which cools the semiconductor element connected to the insulation circuit substrate,
wherein the cooler comprises:
   a heat dissipation substrate joined to the insulation circuit substrate;
   a fin provided on a surface opposite to the joining surface with the insulation circuit substrate on the heat dissipation substrate;
   a case which houses the fin and is connected to the heat dissipation substrate;
   an inlet and an outlet for a coolant which are provided on side walls of the case, the side walls being opposed to each other, and are provided at diagonal positions of the case;
   an introduction path which is connected to the inlet and is formed along the inner surface of a first side wall on which the inlet of the case is provided;
   a discharge path Which is connected to the outlet and is formed along the inner surface of a second side wall on which the outlet of the case is provided; and
   a cooling flow channel which is formed at a position where the fin is housed between the introduction path and the discharge path,
   wherein the height of the opening of the inlet is larger than the height of the introduction path, and, at a connecting portion between the inlet and the introduction path, an inclined surface which is inclined in the longitudinal direction of the introduction path from the bottom surface of the connecting portion is provided.

2. The semiconductor device according to claim 1, wherein the connecting portion further comprises an inclined surface which is inclined from the outside of a third side wall connecting the first side wall and the second side wall of the case toward the fin.

3. The semiconductor device according to claim 2, wherein the connecting portion further comprises an inclined surface which is inclined from the outside of the bottom wall of the case toward the fin.

4. The semiconductor device according to claim 3. wherein the length of the cooling flow channel is larger than the lengths of the introduction path and the discharge path.

5. The semiconductor device according to claim 3, wherein the cooling flow channel is divided by a partition connecting to the introduction path and the discharge path.

6. The semiconductor device according to claim 2, wherein the length of the cooling flow channel is larger than the lengths of the introduction path and the discharge path.

7. The semiconductor device according to claim 2, wherein the cooling flow channel is divided by a partition connecting to the introduction path and the discharge path.

8. The semiconductor device according to claim 1, wherein the introduction path is formed in a shape in which the width of the flow channel is gradually decreased toward the downstream side of the introduction path.

9. The semiconductor device according to claim 8, wherein the length of the cooling flow channel is larger than the lengths of the introduction path and the discharge path.

10. The semiconductor device according to claim 8, wherein the cooling flow channel is divided by a partition connecting to the introduction path and the discharge path.

11. The semiconductor device according to claim 1, wherein the length of the cooling flow channel is larger than the lengths of the introduction path and the discharge path.

12. The semiconductor device according to claim 11, wherein the cooling flow channel is divided by a partition connecting to the introduction path and the discharge path.

13. The semiconductor device according to claim 1, wherein the height of the opening of the outlet is larger than the height of the discharge path, and a connecting portion between the outlet and the discharge path comprises an inclined surface which is inclined from the bottom surface in the longitudinal direction of the discharge path.

14. The semiconductor device according to claim 13, wherein the cooling flow channel is divided by a partition connecting to the introduction path and the discharge path.

15. The semiconductor device according to claim 1, wherein the cooling flow channel is divided by a partition connecting to the introduction path and the discharge path.

16. The semiconductor device according to claim 1, wherein the heat dissipation substrate and the case are formed of metallic materials having different compositions.

17. The semiconductor device according claim 1, wherein the case is manufactured by die casting.

18. A semiconductor device comprising:
a cooler, the cooler comprising:
   a top wall, the top wall having a top surface, a bottom surface, a first side edge and a second side edge opposite the first side edge;
   a first side wail extending from the first side edge of the top wall;
   a second side wall extending from the second side edge of the top wail;
   an inlet provided in the first side wall of the cooler; and
   an outlet provided in the second side wall of the cooler;
an insulation circuit substrate on the top surface of the top wall;
a fin extending from the bottom surface of the top wall;
an introduction path which is connected to the inlet, the introduction path formed between an inner surface of the first side wall and a first end of the fin;
a discharge path which is connected to the outlet, the discharge path formed between an inner surface of the second side wall and a second end of the fin; and
an inclined surface which is inclined in the longitudinal direction of the introduction path from the bottom surface of the connecting portion is provided,
wherein a height of an opening of the inlet is greater than a height of the introduction path.

19. The semiconductor device according to claim 18, wherein a width of the introduction path decreases as the introduction path extends from the inlet, and
wherein a width of the discharge path increases as the discharge path extends toward the outlet.

* * * * *